United States Patent
Feiweier

(10) Patent No.: US 10,185,008 B2
(45) Date of Patent: Jan. 22, 2019

(54) MEDICAL IMAGING EXAMINATION APPARATUS AND OPERATING METHOD

(71) Applicant: Siemens Aktiengesellschaft, Munich (DE)

(72) Inventor: Thorsten Feiweier, Poxdorf (DE)

(73) Assignee: Siemens Aktiengesellschaft, Munich (DE)

( * ) Notice: Subject to any disclaimer, the term of this patent is extended or adjusted under 35 U.S.C. 154(b) by 571 days.

(21) Appl. No.: 14/867,472

(22) Filed: Sep. 28, 2015

(65) Prior Publication Data
US 2016/0091584 A1    Mar. 31, 2016

(30) Foreign Application Priority Data
Sep. 30, 2014    (DE) .......................... 10 2014 219 786

(51) Int. Cl.
G01R 33/54    (2006.01)
G01R 33/483    (2006.01)

(52) U.S. Cl.
CPC ........ G01R 33/543 (2013.01); G01R 33/4835 (2013.01)

(58) Field of Classification Search
CPC .......................... G01R 33/543; G01R 33/4835
See application file for complete search history.

(56) References Cited

U.S. PATENT DOCUMENTS 6,515,478 B1    2/2003    Wicklow et al.
7,218,113 B2    5/2007    Feiweier et al.
(Continued)

OTHER PUBLICATIONS

Wu et al., "Wideband MRI: A New Dimension of MR Image Acceleration," Proc. ISMRM 2009, p. 2678 (2009).
(Continued)

Primary Examiner — Patrick Assouad
Assistant Examiner — Haidong Zhang
(74) Attorney, Agent, or Firm — Schiff Hardin LLP

(57) ABSTRACT

In a method for operating a medical imaging examination apparatus having multiple sub-systems, a control computer controls the sub-systems to execute a scan sequence in which magnetization in at least two subvolumes of an object being scanned is simultaneously manipulated by a sub-sequence and/or used for the scan data acquisition process. A control protocol assigned to the scan sequence is provided to the control device, and sequence control data for the control protocol are determined that define different functional sub-sequences of the scan sequence. Different effective volumes are assigned to each functional sub-sequence, taking into account the aforementioned sub-modules. Effective volume position data are provided to the control device that define the position and extent of the effective volumes assigned to the different functional sub-sequences. Current ambient conditions of the apparatus are determined that are important for the determined relevant sequence control data and assigned effective volumes. Control signals for the different sub-systems are generated from the sequence control data and the effective volume position data and the determined physical ambient conditions, for executing the scan sequence such that the individual functional sub-sequences are locally optimized at least with respect to a sub-region of their assigned effective volume.

11 Claims, 7 Drawing Sheets

(56) References Cited

U.S. PATENT DOCUMENTS

| | | | |
|---|---|---|---|
| 8,111,069 B2 | 2/2012 | Feiweier | |
| 2010/0286802 A1* | 11/2010 | Feiweier | G01R 33/54 700/90 |
| 2011/0172515 A1 | 7/2011 | Fautz et al. | |
| 2011/0304334 A1* | 12/2011 | Feiweier | G01R 33/56341 324/314 |
| 2012/0217966 A1 | 8/2012 | Feiweier | |
| 2012/0249137 A1 | 10/2012 | Witschey et al. | |
| 2013/0265048 A1* | 10/2013 | Kalechofsky | A61B 5/055 324/309 |
| 2015/0362574 A1 | 12/2015 | Wu et al. | |

OTHER PUBLICATIONS

Feinberg et al., "Simultaneous Echo Refocusing in EPI," Magnetic Resonance in Medicine, vol. 48, pp. 1-5 (2002).

Souza et al., "SIMA: Simultaneous Multislice Acquisition of MR Images by Hadamard-Encoded Excitation," Journal of Computer Assisted Tomography, vol. 12(6), pp. 1026-1030 (1988).

De Graaf et al., "Dynamic Shim Updating (DSU) for Multi-Slice Signal Acquisition," Proc. Intl. Soc. Mag. Reson. Med., vol. 10, p. 536 (2002).

Larkman et al., "Use of Multicoil Arrays for Separation of Signal from Multiple Slices Simultaneously Excited," Journal of Magnetic Resonance Imaging, vol. 13, pp. 313-317 (2001).

Meier et al., "Concomitant Field Terms for Asymmetric Gradient Coils: Consequences for Diffusion, Flow, and Echo-Planar Imaging," Magn. Reson. Med, vol. 60, pp. 128-134 (2008).

\* cited by examiner

MEDICAL IMAGING EXAMINATION APPARATUS AND OPERATING METHOD

BACKGROUND OF THE INVENTION

Field of the Invention

The invention concerns a method for operating a medical imaging examination apparatus that has multiple subsystems, by using slice multiplexing, and a corresponding medical imaging examination apparatus and electronically readable data medium.

Description of the Prior Art

Medical imaging examination apparatuses such as magnetic resonance apparatuses and computed tomography apparatuses are complex systems with a large number of technical subsystems. These include, in a magnetic resonance apparatus, a basic field magnet system, a gradient system, a shim system and a radio frequency transmission system as well as a radio frequency receiving system.

In order to generate images or spectroscopic data from an examination object with a magnetic resonance apparatus, the examination object is positioned in the scanner in a strong homogeneous basic magnetic field, also known as the $B_0$ field, generated by the basic field magnet system with a field strength of 0.2 Tesla to 7 Tesla or more, so that the nuclear spins in the object align along the basic magnetic field direction. In order to trigger nuclear spin resonance, radio frequency excitation signals (RF pulses) are radiated into the examination object with suitable antennas of the radio frequency transmission system, so that the nuclear spin of particular atoms stimulated to resonance by this radio frequency field are tilted through a particular flip angle relative to the magnetic field lines of the basic magnetic field. The nuclear spin resonance that is triggered, i.e. the radio frequency signals (also "magnetic resonance signals") emitted during the precession of the nuclear spin are detected by the radio frequency receiving system, typically digitized, and normally stored as complex number values (if a spatial reference is given) in a "k-space matrix" as "k-space data". For example, in single-voxel spectroscopy scans (without spatial reference), the digitized data are stored as complex time signals, also known as "FID data". On the basis of the k-space data or FID data, MR images can be reconstructed or spectroscopic data can be determined. For spatial encoding of the scan data, rapidly switched magnetic gradient fields are overlaid on the basic magnetic field by the gradient system. The shim system is intended to homogenize the magnetic fields.

All these technical modules must be suitably operated in a coordinated way by a control system. The adjustment and switching of the individual subsystems necessary for a particular imaging process must be undertaken by the control system at the right time point in each case. Typically, the volume to be imaged within an imaging sequence is recorded in subvolumes, for example, in 2-D imaging, in multiple slices or, in 3-D imaging, in multiple "slabs". The subvolumes recorded in this way are then assembled into an overall volume. A further definition of subvolumes can be given as "regions of interest" (ROI) or "volumes of interest" (VOI) defined, for example, by the operator. Furthermore, in magnetic resonance systems, additional subvolumes arise when determining local saturation regions or local preparation or labeling pulses.

As mentioned above, sequence control data are transmitted to the control device for coordinated control, typically based on a "scan protocol". These sequence control data define different functional subsequences of a complete scan sequence. In a magnetic resonance recording, for example, a first subsequence may be a pulse sequence in order to achieve a saturation locally in a particular region. Further subsequences can contain, for example, particular preparation pulses and yet further subsequences serve for successive excitation and for receiving the magnetic resonance signals in different slices or slabs.

Typical methods based on MR technology, such as tomographic imaging (MRT—magnetic resonance tomography) or spectroscopy (MRS—magnetic resonance spectroscopy) require "benign" ambient physical conditions in order to ensure the best possible quality in the data recorded. For example, this relates to the spatial homogeneity, temporal stability and the absolute accuracy of the relevant magnetic fields and radio frequency fields, that is, the main magnetic field ($B_0$) and the gradient and radio frequency fields ($B_1$).

Conventionally, deviations from ideal ambient conditions can at least partially be compensated for, for example, by system-specific settings known as "tune-ups", in particular with regard to eddy current-induced dynamic field disruptions or gradient sensitivities or by examination object-specific settings, particularly in relation to susceptibility-related static field disruptions or spatial variations of the radio frequency field. However, the compensation settings specified before the beginning of a scan conventionally remain valid throughout the entire scan ("static" adjustment).

For spatially variable ambient conditions that cannot be entirely compensated, this entails a compromise for data quality.

This also applies to MR scanning methods for the simultaneous acquisition of a plurality of slices using a common sub-sequence. In general these can be characterized by, at least during part of the scan, the transverse magnetizations of at least two slices being selectively used simultaneously for the excitation and/or acquisition process of the scan data. These methods are also known as multi-slice imaging or slice multiplexing methods. In contrast to these methods, in the case of conventional, established multi-slice imaging, the signal of at least two slices is acquired alternately, i.e. completely independently of one another with a correspondingly longer scan time.

The slice multiplexing methods include, for example:

Hadamard encoding (e.g. Souza et al., J. CAT 12:1026 (1988)): Two (or more) slices are excited simultaneously, a defined signal phase is applied to each slice by appropriate tailoring of RF excitation pulses. The magnetization signal of both slices is received simultaneously. A similar second excitation of the two slices is carried out, but with a changed relative signal phase in the slices. The rest of the imaging process (phase encoding steps) proceeds as usual, the method can be combined with any acquisition techniques ((multi-)gradient echo, (multi-)spin echo, etc.). The signal information of the two slices can be separated out from the two acquisitions by means of suitable computing operations.

Simultaneous echo refocusing (SER, SIR, e.g. Feinberg et al., MRM 48:1 (2002)): Two (or more) slices are excited in quick succession, defined spatial dephasing is applied to each slice by suitable gradient pulses. The signal of the simultaneously manipulated magnetization from both slices is received by means of suitable gradient switchings at brief intervals. The rest of the imaging process (phase encoding steps) proceeds as usual, the method can be combined with any acquisition techniques ((multi-)gradient echo, (multi-)spin echo, etc.). Images of the two slices can be generated as usual from the separately acquired data.

Broadband data acquisition (e.g. Wu et al., Proc. ISMRM 2009:2768): Two (or more) slices are excited simultaneously. The signal of the magnetization from both slices is received simultaneously. During data reception, a gradient is switched along the slice normal resulting in separation of the signals of the two slices in the frequency domain. The rest of the imaging process (phase encoding steps) proceeds as usual, the method can be combined with any acquisition techniques ((multi-)gradient echo, (multi-)spin echo, etc.). By suitable filtering, the signals of the two slices can be separated out from the simultaneously acquired data.

Parallel imaging in the slice direction (e.g. Larkman et al. JMRI 13:313 (2001)): Two (or more) slices are excited simultaneously. The signal of the magnetization from both slices is received simultaneously using at least two (or more) coil elements. The rest of the imaging process (phase encoding steps) proceeds as usual, the method can be combined with any acquisition techniques ((multi-)gradient echo, (multi-)spin echo, etc.). An additional calibration scan for determining the spatial receive characteristic of the coil elements is carried out. By suitable computing operations (e.g. GRAPPA algorithm) the signals of the two slices can be separated out from the simultaneously acquired data.

However, these slice multiplexing methods have hitherto been combined with static adjustment methods at best. Even the use of such optimizations of static adjustment parameters only can merely achieve a compromise in respect of the possible image quality for individual subvolumes.

De Graaf et al. describe in "Dynamic Shim Updating (DSU) for Multi-Slice Signal Acquisition", Proc. Intl. Soc. Mag. Reson. Med. 10, p. 536, 2002, a rudimentary form of a dynamic adjustment of the shim currents of the field coils for the $B_0$ shim in functional multi-slice MR imaging. For this purpose, a firm field determination sequence is created for determining spatial field changes of first or higher orders which must be exactly matched to the corresponding parameters (e.g. slice positions and orientations) of the desired imaging sequence. The field determination sequence records the data necessary for field determination and analyzes them in order to calculate optimized shim currents (of first or higher order) therefrom for each slice to be scanned with the imaging sequence. Subsequently, the imaging sequence is started with the optimized shim currents. The user needs to watch very closely for consistency between the imaging sequence and the field determination sequence since, otherwise, inconsistencies can lead to a worsening of the image quality. Therefore, for each imaging sequence and each change of such a sequence, a new field determination sequence must be created and carried out before the scan with the imaging sequence. These methods are therefore very complex and difficult for the user to combine with other, for example static, adjustments since interactions between different parameters cannot be taken into account or only to a limited extent. If statically adjusted parameters are changed, this can have effects on the optimum dynamic settings of the shim currents and a new field determination sequence and calculation of the optimized shim currents would have to be carried out. Furthermore, the optimization is restricted to the slices of the imaging sequence. Smaller volumes, for example, regional saturation volumes are not taken into account here.

In DE 10 2009 020 661 B4, a method is described with which parameters of a scan sequence, for example in magnetic resonance technology can be adapted at the run time of the scan sequence. Furthermore, it is described therein that different functional subsequences are typically associated with different effective volumes. For each subsequence, a different subvolume of the overall scan volume is relevant.

There is currently no known way of combining the two last-mentioned methods with slice multiplexing methods.

SUMMARY OF THE INVENTION

An object of the invention is to provide a method for operating a medical imaging examination device using a slice multiplexing method and having multiple sub-systems and a control computer that controls the sub-systems in a coordinated manner in order to carry out a scan sequence that allows sequence control data to be adapted (adjusted) reliably and in a user-friendly and time-optimized manner to current ambient conditions in combination with slice multiplexing methods, so as to overcome the aforementioned disadvantages of known methods. A further object is to provide a medical imaging apparatus and a non-transitory, computer-readable data storage medium encoded with programming instructions for implementing such a method.

The invention is based on the insight that, for scans in which the scanned object volume relevant for signal excitation and reception changes during the scan, the quality of the data can be significantly improved by dynamic optimization of the compensation settings for the currently relevant volume. This applies, for example, to two-dimensional multi-slice imaging, multi-voxel spectroscopy (e.g. in conjunction with successive localized excitation) or using various magnetization preparations (e.g. fat suppression, regional saturation, inversion, markings, etc.). However, for combining dynamic adjustments of this kind with slice multiplexing methods, provision must be made to enable e.g. compensation settings for the at least two slices simultaneously excited and/or acquired by slice multiplexing to be optimized simultaneously. The same applies, for example, if a plurality of disjunctive regions are to be simultaneously excited or marked (labeled), i.e. quite generally if, in at least two spatially separate subvolumes, the magnetization is simultaneously manipulated and/or used for the scan data acquisition process at any time during the scan.

Simultaneous saturation is useful, for example, if the signal is to be suppressed on both sides of a slice stack to be scanned, in order to reduce contributions of inflowing "fresh" magnetization (e.g. due to blood flow). Simultaneous saturation (instead of successive saturation) can be very rapidly achieved and has smaller efficiency variations because of relaxation effects.

An example of simultaneous labeling is e.g. in cases where the signal is to be marked in a plurality of arteries (possibly using a different characteristic), in order to identify the tissue supplied by the respective vessel. Here as well, simultaneous labeling (instead of successive labeling) can be implemented more quickly and exhibits smaller efficiency variations because of relaxation effects.

This object is achieved by a method for operating a medical imaging examination device having multiple sub-systems and a control computer that controls the sub-systems in a coordinated manner in order to execute a scan sequence with which the magnetization in at least two subvolumes of a scanned object is simultaneously manipulated by a sub-sequence and/or used for the scan data acquisition process.

In such a method according to the invention, a control protocol of a scan to be carried out is provided to the control computer and the control computer determines sequence control data that are relevant for the control protocol, which define different functional sub-sequences of a scan sequence pertaining to the scan protocol. The control computer assigns different effective volumes to each functional sub-sequence, taking into account subvolumes manipulated with respect to their magnetization by an associated sub-sequence and/or used for the scan data acquisition process. Effective volume position data are provided to the control computer that define a position and extent of the effective volumes assigned to the different functional sub-sequences. The control computer determines current ambient conditions of the medical imaging examination device that affect the relevant sequence control data and assigned effective volumes. Control signals are generated for the different sub-systems based on the relevant sequence control data and the effective volume position data and the determined physical ambient conditions for carrying out the scan sequence, such that the individual functional sub-sequences are locally optimized at least in respect of a sub-region of their assigned effective volume.

The method according to the invention allows dynamic adjustments of setting parameters (control signals) of a control protocol to be performed in an optimized manner, also in combination with slice multiplexing methods and other methods in which the magnetization in at least two subvolumes of a scanned object is simultaneously manipulated in a least one time interval and/or used for the scan data acquisition process. This improves the image quality as well as the data quality generally in said methods, particularly in the case of slice multiplexing methods. This method can be easily integrated into existing adjustment methods for single-slice scans.

A medical imaging examination device according to the invention having a plurality of sub-systems comprises a control device designed to carry out a method according to the invention, wherein the control device is designed to control the sub-systems in a coordinated manner for performing a scan sequence based on sequence control data, said sequence control data defining different functional sub-sequences of the scan sequence, to which sub-sequences different effective volumes are assigned.

A computer program according to the invention implements a method according to the invention on a control device when it is executed on the control device.

An electronically readable data medium according to the invention comprises thereon stored electronically readable control information which comprises at least one computer program according to the invention and is designed to carry out a method according to the invention when the data medium is used in a control device of a medical imaging examination device.

DESCRIPTION OF THE PREFERRED EMBODIMENTS

Figure 1:
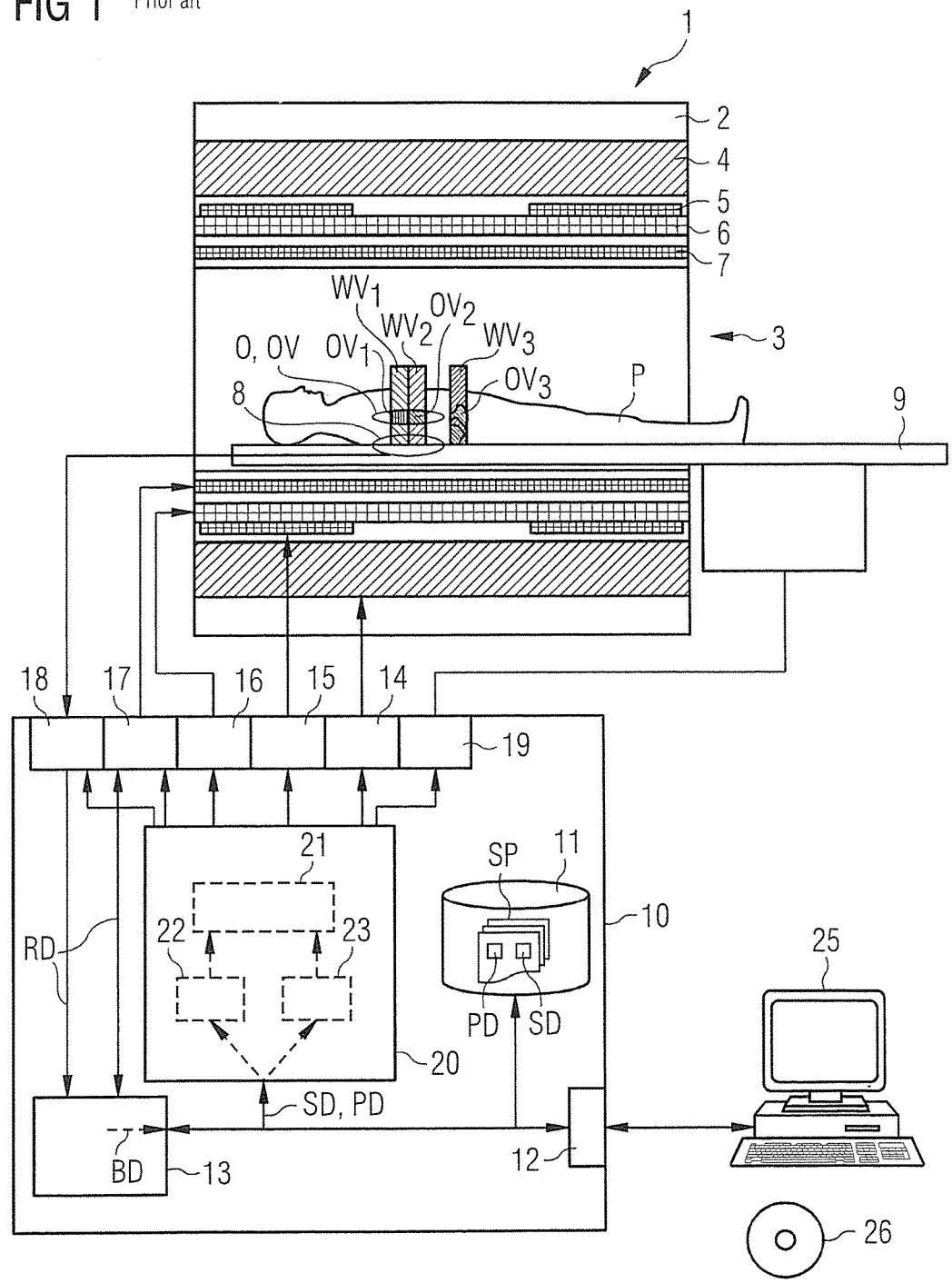
FIG. 1 schematically illustrates an exemplary embodiment of a per se known medical imaging examination apparatus in the form of a magnetic resonance system.

FIG. 1 shows a basic schematic form of a medical imaging examination apparatus 1 that although the basic components are known, can be configured according to the invention. The apparatus includes the actual magnetic resonance scanner 2 with an examination space 3 or patient tunnel situated therein. A table 9 can be moved into this patient tunnel 3 through various positions so that an examination object, e.g. a patient P or test subject lying thereon can be placed during an examination at a particular position within the magnetic resonance scanner 2 relative to the magnetic system and the radio frequency system arranged therein and is also displaceable between different positions during a scan. It should be mentioned at this point that the exact construction of the magnetic resonance scanner 2 is not essential. Thus, for example, a cylindrical system with a typical patient tunnel can be used, but also a C-arm-shaped magnetic resonance device which is open at one side.

Basic components of the magnetic resonance scanner 2 are a basic field magnet 4, a number of shim coils 5 and magnetic field gradient coils 6 as well as a whole-body radio frequency coil 7. The reception of magnetic resonance signals induced in the examination object can take place by the whole body coil 7, with which typically the radio frequency signals for inducing the magnetic resonance signals are also emitted. It is also possible to receive these signals, for example, with local coils 8 placed on or under the patient. All of these components are known to those skilled in the art and are shown only schematically in FIG. 1.

The individual components are controlled by a control computer 10, which is shown here in the form of a combined block. This can be a control computer that can be composed of a number of individual computers, possibly spatially separated and connected to one another by suitable cables or the like. This control computer 10 is connected, via a terminal interface 12, to a terminal 25, via which an operator can control the entire system 1. The terminal interface 12 should be understood as meaning any connection of input devices, such as a mouse and/or keyboard, and display devices, for example, a screen or monitor of the terminal 25 to the control computer 10.

This control computer 10 has, inter alia, a basic magnetic field control apparatus 14 that monitors the cooling of the basic field magnet, a shim coil control apparatus 15, and a gradient coil control apparatus 16. The whole body coil 7 is controlled by a radio frequency transmission/receiving unit 17. The radio frequency transmitting/receiving unit 17 has, for example, a radio frequency pulse amplifier for amplification and shaping of the radio frequency pulses and an NCO with which the frequency and phase position of the radio frequency pulses can be stipulated. With a further radio frequency receiving unit 18, signals detected by local coils 8 are read out. This radio frequency receiving unit (processor) 18 can include, for example, a coil selection unit in order to select the relevant local coil from among multiple local coils that are available, and an NCO for setting the frequency and phase position. A patient table control unit 19 serves to control the table 9.

The basic field magnet 4, together with its control apparatus 14, the basic magnetic field system 4, 14, the shim coils 5 together with the associated control apparatus 15, the shim system 5, 15, the magnetic field gradient coils 6 with the associated control apparatus 16, the gradient system 6, 16, the radio frequency coils 7 together with their radio frequency transmission/receiving unit 17, form a radio frequency transmission/receiving system 7, 17 and the local coils 8 together with their radio frequency receiving unit 18 form a further radio frequency receiving system 8, 18.

All the control apparatuses 14, 15, 16, 19 and the radio frequency transmitting and/or receiving units 17, 18 are controlled in a coordinated manner by a central control computer 20 so that the basic magnetic fields, gradient fields and radio frequency pulses required for the execution of a scan are output-synchronized, the shim coils are correctly set and the table 9 is in the correct position. Furthermore, it must be ensured that, at the relevant time point, the signals are read out at the local coils 8 by the radio frequency receiving unit 18 and any signals at the whole body coil 7 are read out by the radio frequency transmitting/receiving unit 17 and further processed in an appropriate manner.

The signals or raw data RD acquired in this way are then passed on to an image reconstruction unit 13 in which the desired magnetic resonance image data or spectroscopic data BD are reconstructed in order then to present them on the screen of the terminal 25 or to store them in a memory 11.

The magnetic resonance scanner 2 of this type and the associated control computer 10 also have or can have a number of further components that will not be discussed in detail herein. For example, the examination apparatus 1 can be coupled, via a suitable interface, to a network, for example, a radiological information system (RIS) in order to receive control protocols that can be used in the apparatus 1 or, for example, to transmit magnetic resonance images generated by the apparatus 1, to save them in external mass storage units or to transfer them to diagnosis stations or printers or the like.

The generation of the control signals for the individual control apparatuses 14, 15, 16, 19 and the radio frequency transmitting and/or receiving units 18, 17 by the central control computer 20 is accomplished via a control signal generating module 21, realized in the form of software, in a processor of the control computer 10 that generates the control signals ST on the basis of sequence control data SD that define the different subsequences of the complete scan sequence. An example of a scan sequence composed of multiple subsequences will be described below with reference to FIGS. 3 to 5. The sequence control data SD are typically set within control protocols SP that characterize the scan protocol of the scan to be carried out and can be stored for the apparatus 1 in a memory 11. A control protocol SP of this type contains all the control data necessary for the smooth execution of a particular scan sequence. The operator can select a protocol of this type SP for a scan to be carried out, by a suitable user interface via the terminal 25 and then have the scan performed fully automatically on the basis of this control protocol SP. However, it is also possible for the operator to call and modify a control protocol SP in order to carry out specific scans. It is also possible to select control protocols SP via a further network interface (not shown) on other computers, particularly from the manufacturer of the magnetic resonance system or made available by specialist service providers involved in the development of control protocols.

As explained above, to maximize image quality it is advisable for the individual sub-systems to be controlled for a particular sub-sequence such that they are optimized to the effective volume essential for the particular sub-sequence or a particular part thereof. This has been conventionally done by the developer of a control protocol taking into account, in advance, which effective volume is relevant to which sub-sequence, and then modifying the sequence control data, or the parameters for the sub-systems accordingly in the control protocol, so that optimization is achieved in the defined effective volume using the sub-sequence.

The method described herein can also be embodied in the form of a computer-readable storage medium that causes program the method to be implemented by the control computer 10 when programming instructions encoded in the storage medium are executed by the control computer 10. Such an electronically readable data medium 26 has electronically readable control information stored thereon.

Figure 2:
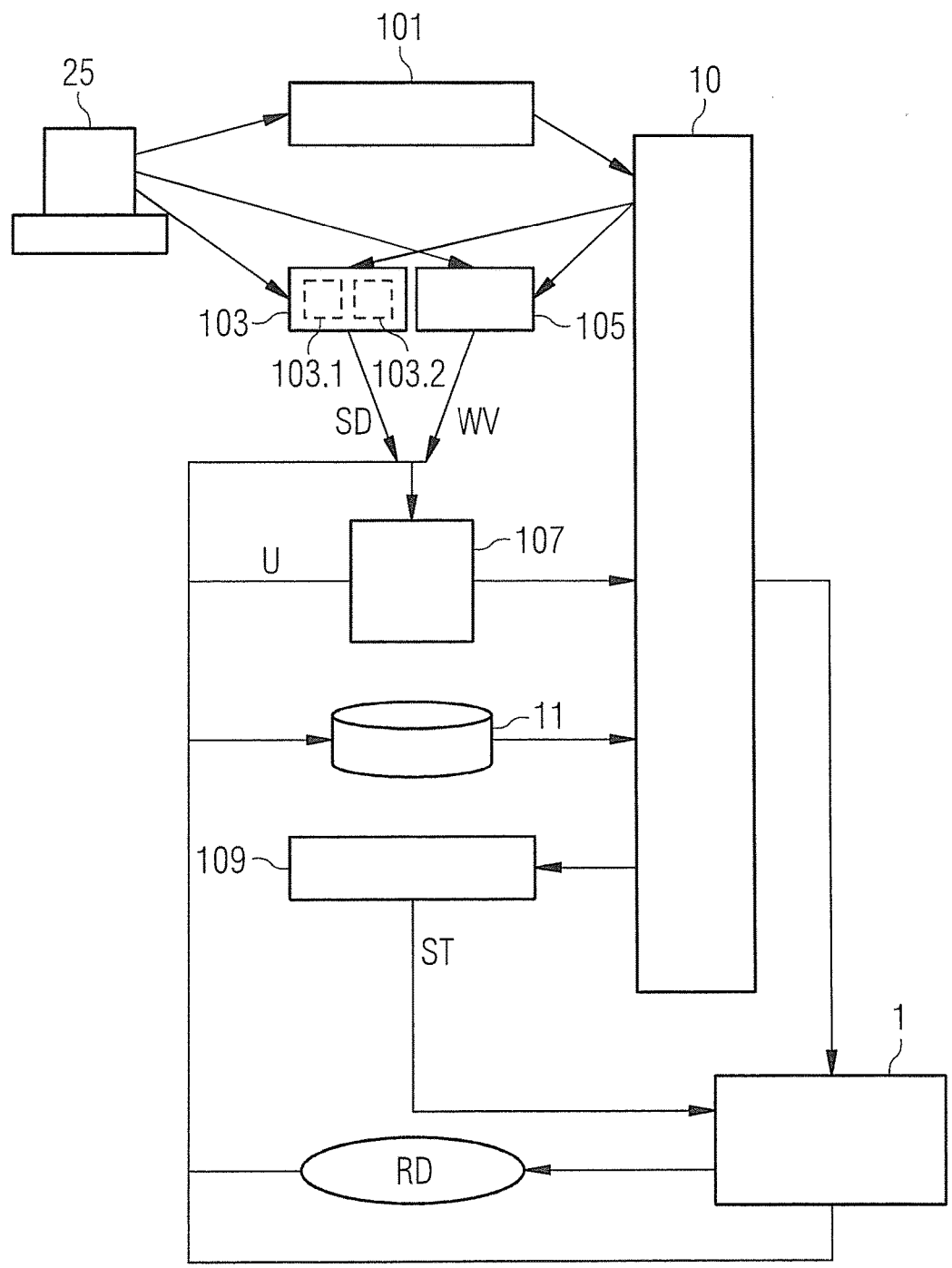
FIG. 2 shows a flow chart of a method according to the invention.

FIG. 2 shows the order of events in an inventive method for operating a medical imaging examination apparatus, wherein the medical imaging examination apparatus 1 has multiple sub-systems and a control computer 10 that controls the sub-systems in a coordinated manner for carrying out a slice multiplexing scan sequence, or another scan sequence with which the magnetization in at least two subvolumes of an object being scanned is simultaneously manipulated by a sub-sequence and/or used for the scan data acquisition process.

Prior to the start of a scan to be carried out on a patient P or other object to be scanned, in a step 101 the control protocol assigned to a scan to be carried out is first transmitted to the control computer 10 of the medical imaging examination apparatus 1. For this purpose, inputs can be made by a user at the terminal 25 of the medical imaging examination apparatus 1, e.g. a particular control protocol can be selected and/or also modified according to present requirements as already described above.

In a further step 103, the sequence control data SD that are relevant to the transmitted control protocol and that define different functional sub-sequences of a scan sequence pertaining to the control protocol, are determined and stored in the memory 11. Depending on the type of the desired scan, which predefines e.g. the sequence type, further scan parameters and a body region to be examined, in short the control protocol, e.g. dynamic adjustment may be useful for a different selection of sequence control data. For example, if a scan must be relatively insensitive to variations in the $B_1$ field, to simplify the course of the subsequent scan the corresponding sequence control data SD, such as transmitter scaling for the flip angle setting or also $B_1$ shim settings, can be classified as sequence control data SD to be set statically (step 103.1), whereas other sequence control data relating to the $B_0$ field is classified as sequence control data SD to be adjusted dynamically (step 103.2). In this way the robustness of the method can be improved and the range of scans to be carried out to determine the ambient conditions can be reduced.

In step 105 different effective volumes WV are assigned to each functional sub-sequence, taking into account the respective subvolumes manipulated by the functional subsequence in respect of their magnetization and/or used for the acquisition process, and are stored. According to the invention, at least two subvolumes of the scanned object are manipulated with respect to their magnetization and/or are used for the acquisition process, using at least one functional sub-sequence. The at least two subvolumes manipulated with respect to their magnetization and/or used for the acquisition process are therefore taken into account at least once for such a sub-sequence. This can take place automatically on the basis of the control protocol. For example, in the case of a desired multi-slice scan, each slice to be acquired can define such a volume. Another example is a regional saturation volume predefined by the control protocol. Thus, as soon as the control protocol is specified, a list of all the effective volumes WV relevant in the course of the scan can be drawn up and stored. Further details will be given below, first generally with reference to FIGS. 3 to 5, then in the context of the particular circumstances in the case of slice multiplexing methods with reference to FIGS. 6 to 9.

For example, each effective volume of a sub-sequence can comprise the at least two slices excited using an associated sub-sequence for acquiring the scan data.

It is additionally possible for such a list of effective volumes WV to be automatically modified or supplemented on the basis of the imaging sequence selected via the control protocol. This is particularly useful in cases where such corrections of the user-specified parameters in the form of the control protocol are necessary for reasons of MR physics, e.g. to avoid artefacts such as e.g. the so-called inflow when using magnetization-inversion techniques or for chemical shift artefacts in the case of regional saturation. It is also conceivable for the scan sequence selected by the control protocol to require other volumes for specific manipulations of the spin system internally, i.e. without an associated user-manipulable parameter, and these are therefore acquired as effective volumes WV.

In addition, direct or also only indirect manipulation on optimization volumes by the user can be provided. For example, the user can predefine a volume as an optimization volume (e.g. volume of interest) which e.g. includes the anatomical region of interest. The respective effective volumes WV can then be limited in each case to the sub-region of the intersection of themselves with the applicable optimization volume. The method according to the invention therefore allows optimization for any sub-regions of the effective volumes and is not limited to e.g. the effective volumes predefined by the scan, such as the slices, for example, in the case of multi-slice scans.

The current ambient conditions U of the medical imaging examination device 1 that are important for the particular sequence control data SD and assigned effective volumes WV are determined in step 107. The assigned effective volumes WV and the required control sequence data SD determined and in particular their classification into statically to-be-acquired 103.1 and dynamically to-be-adjusted sequence control data 103.2 can be used. The classification of the particular sequence control data SD specifies the physical ambient conditions U for which a global value suffices (in the case of statically to-be-applied sequence control data), and specifies when local values for the ambient conditions U are required (in the case of dynamically to-be-adjusted sequence control data). For global values, a quickly performable adjustment scan using the medical imaging examination device 1 is generally sufficient. For local values, more extensive adjustment scans are required in some cases. For example, local values of the ambient conditions U can be determined by successive adjustment scans for each relevant effective volume WV or rather the relevant sub-region of the effective volume. This procedure is a simple and established method, but is time consuming and must be repeated if the sequence control data changes. However, by limiting this procedure to adjustment scans only for the sequence control data relevant for the respective control protocol, the number of adjustment scans to be carried out and therefore the time and effort is limited again. Alternatively, in a. one-time overhead expenditure, cards of the physical ambient conditions U can be acquired that can then be used as the base data for any sequence control data SD. For example, cards of the $B_0$ field distribution and/or cards of the $B_1$ field distribution, the latter possibly for a number of, or even all the elements of a transmit system comprising a plurality of transmit elements, can be acquired for this purpose. Established adjustment scans can be used in both cases. If ambient condition data for relevant effective volumes WV or relevant sub-regions of the effective volumes are already available from earlier adjustment scans, such data can be reused without rescanning. Therefore, adjustment data once acquired, such as already determined ambient conditions for particular relevant effective volumes WV or relevant sub-regions of the effective volumes, can be used for a number of scans.

In the control computer 10, in step 109, control signals ST for the scan sequence are calculated on the basis of the sequence control data SD determined, the effective volumes WV assigned and the critical, current ambient conditions U determined and are stored in the memory 11 and/or used to control an ongoing scan using the apparatus 1. This calculation is performed such that the functional sub-sequences of the scan sequence are locally optimized at least in respect of a sub-region of their assigned effective volume WV, e.g. of the region of intersection between the respective effective volume and an optimization volume.

The control signals ST can be generated (step 109) prior to the start of the actual scan using the medical imaging apparatus 1, wherein the control signals ST generated are in this case loaded into the control computer 10 from a memory 11 during the scan and forwarded to the scanner of the apparatus 1.

However, it is also conceivable for the control signals ST to be generated (step 109) as required during the ongoing scan, and for the control signals ST generated to be forwarded directly to the scanner of the medical imaging apparatus 1 for the scan.

In all of these cases, the central control computer 20 of the control computer 10 can have, in addition to a control signal generating module 21, a sequence control data determining module 22 that detects and reads out the sequence control data SD within a control protocol SP. In addition, the central control computer 20 preferably has a position data determining module 23 that detects the effective volume position data PD in the control protocol SP, and the thus obtained sequence control data and position data are then processed in a suitable manner by the control signal generating module 21 in order to achieve the desired optimization. In principle the sequence control data determining module 22 and the position data determining module 23 can also be implemented as a combined module that detects the sequence control data SD and the effective volume position data PD and transfers that data to the control signal generating module 21. In addition, the sequence control data determining module and the position data determining module can also be incorporated into the control signal generating module 21. These modules have been shown separately in FIG. 1 in order to show that the optimization to the effective volumes assigned to the individual sub-sequences of the scan sequence takes place fully automatically in the central control computer 20.

The position data determining module 23 can be designed such that it determines, for example, a limited optimization volume for individual sub-sequences on the basis of effective volume position data PD obtained and on the basis of image data BD produced using the reconstruction unit 13 in previous overview scans.

An example of when this is useful is schematically illustrated in FIG. 1 on the patient P in the patient tunnel 3. Shown here are three different slices for which particular sub-sequences within a scan sequence are to be carried out. Each of these slices has a specific effective volume $WV_1$, $WV_2$, $WV_3$, but only part of this volume actually comprises part of the patient P under examination. Regions in the effective volume $WV_1$, $WV_2$, $WV_3$ outside the patient's body carry no essential image information of any kind. As an optimization volume, it therefore makes sense to used only the sub-region of the effective volume $WV_1$, $WV_2$, $WV_3$ which overlaps e.g. with the body of the patient P. In the case of the third slice $WV_3$, this optimization volume $OV_3$ is the entire region which is produced as the intersection between the effective volume $WV_3$ and the volume of the patient's body.

Another variant is illustrated by reference to the other two effective volumes $WV_1$, $WV_2$. Here it is assumed that, within the body of the patient P, a particular organ O is to be examined as the scanned object O. This organ O has a particular object volume OV. Because only this volume OV is of interest, here the intersection of the object volume OV with the effective volumes $WV_1$, $WV_2$ is created in order to find the respective optimization volumes $OV_1$, $OV_2$. Should the case arise that an effective volume has no intersection with an associated optimization volume, creation of the intersection can be dispensed with, for example, and only the effective volume be considered, or the optimization volume for the associated effective volume having no intersection with the optimization volume can be extrapolated as a new optimization volume to be taken as a basis. Such a case could occur, for example, if the slices to be scanned that are provided for the scan are larger than the VOI specified by the user or larger than the organ to be imaged.

The specifics of determining the effective volumes for slice multiplexing methods will be examined with reference to FIGS. 6 to 9.

If the control signals were generated prior to the start of the scan by the medical imaging apparatus 1, the control computer 10 accesses the control signals ST stored for the scan at the start thereof. Here, for example, a stored control signal ST pertaining to a current effective volume of the ongoing scan or possibly changed after the plausibility check is loaded from the memory 11 and used to control the scan.

If the control signals are generated while the scan is ongoing, they are used directly for the scan.

In both cases, the current effective volume of the scan sequence can always be determined in the course of the scan. A control signal to be used in respect of the current effective volume determined can then be determined from the stored control signals.

The control signals control the medical imaging examination apparatus 1, specifically the scanner thereof, causing it to produce raw data RD which can then in turn be stored in the memory 11 or reconstructed as image data or spectroscopy data and if necessary displayed.

Figure 3:
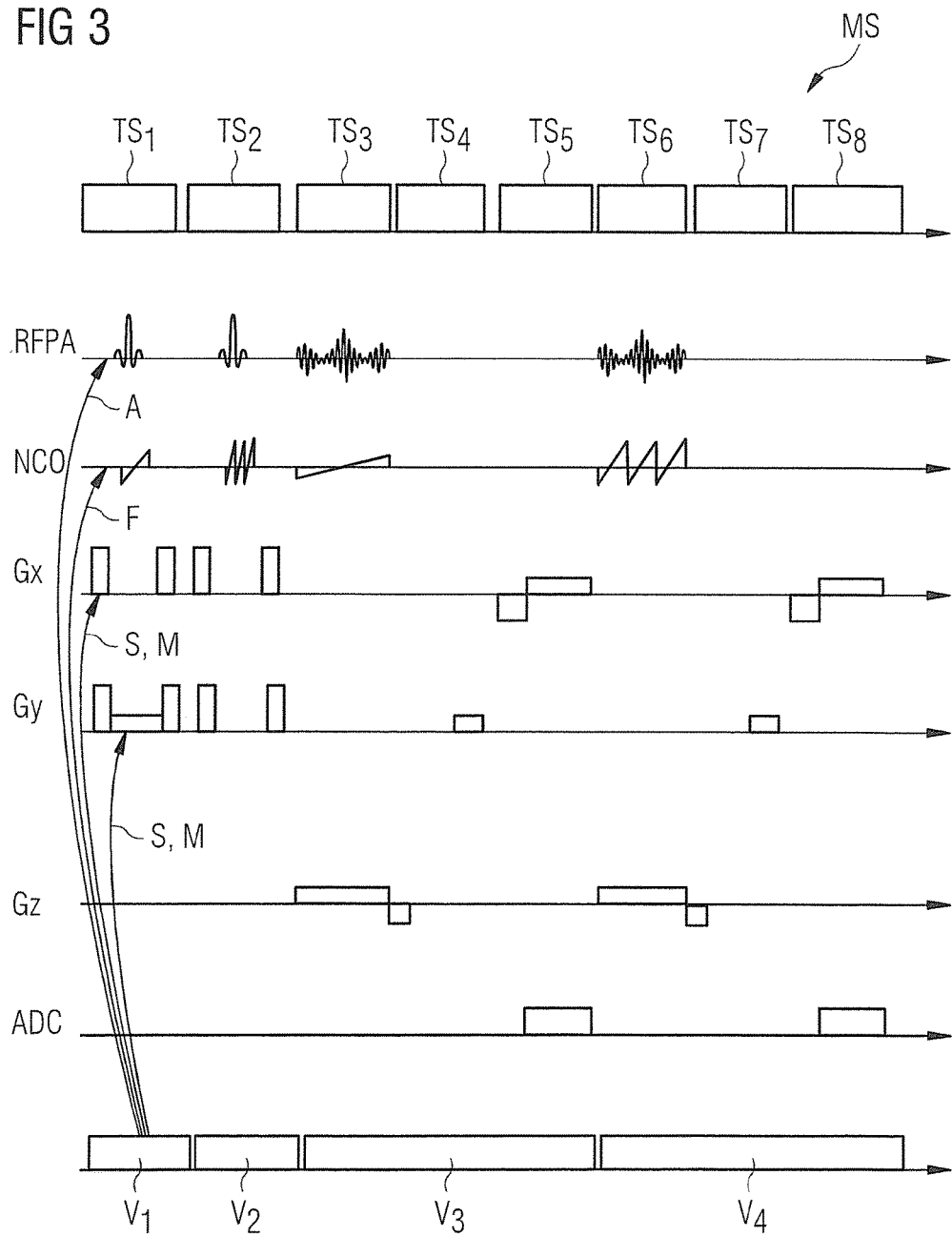
FIG. 3 shows a simplified example of a scan sequence having a number of sub-sequences and their assigned effective volumes with a representation of the parameters optimized to the first effective volume for the first sub-sequence for the individual sub-systems.
Figure 4:
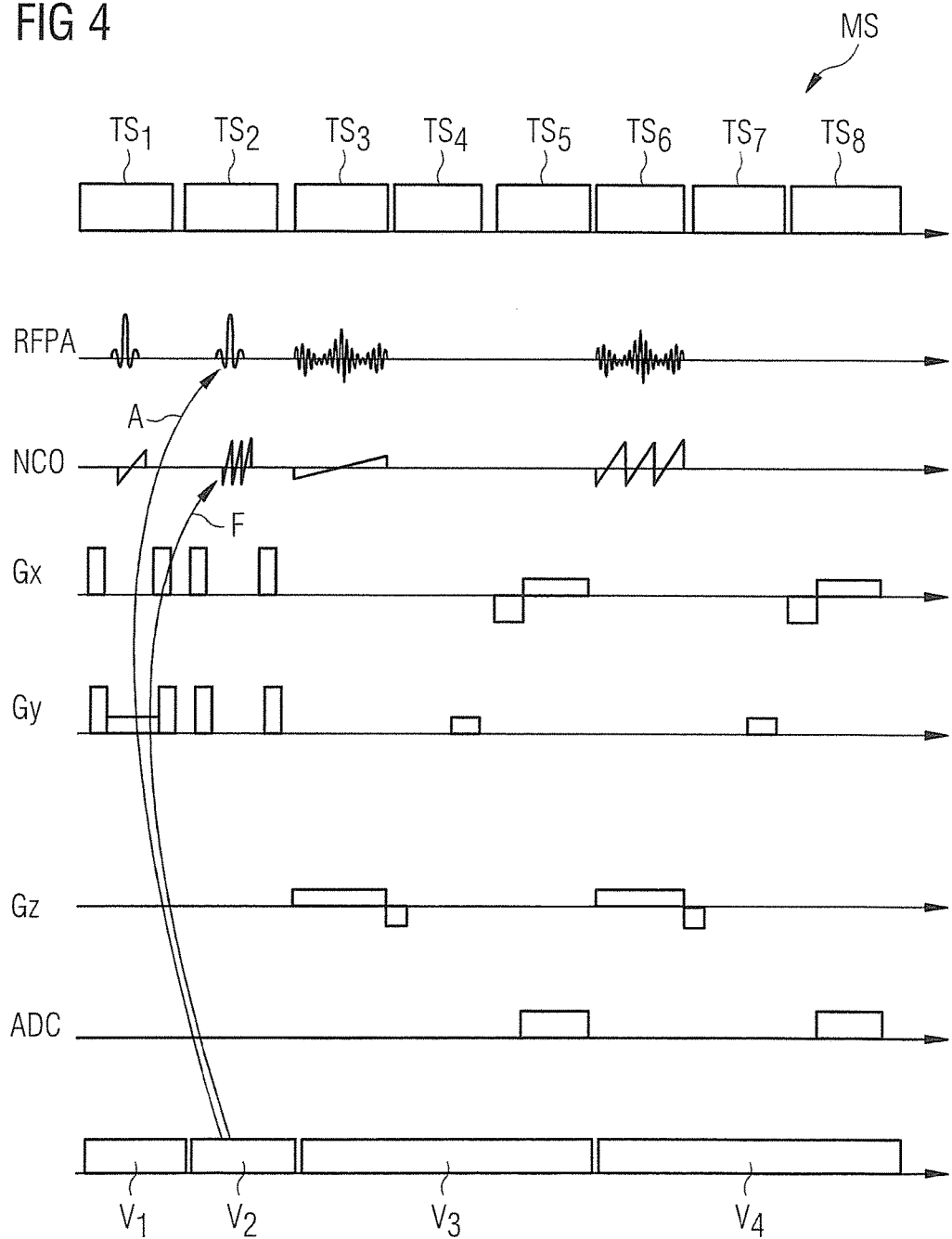
FIG. 4 shows the scan sequence having the individual sub-sequences and assigned effective volumes as in FIG. 3, but with a representation of the sub-system parameters optimized to the second effective volume for the second sub-sequence.
Figure 5:
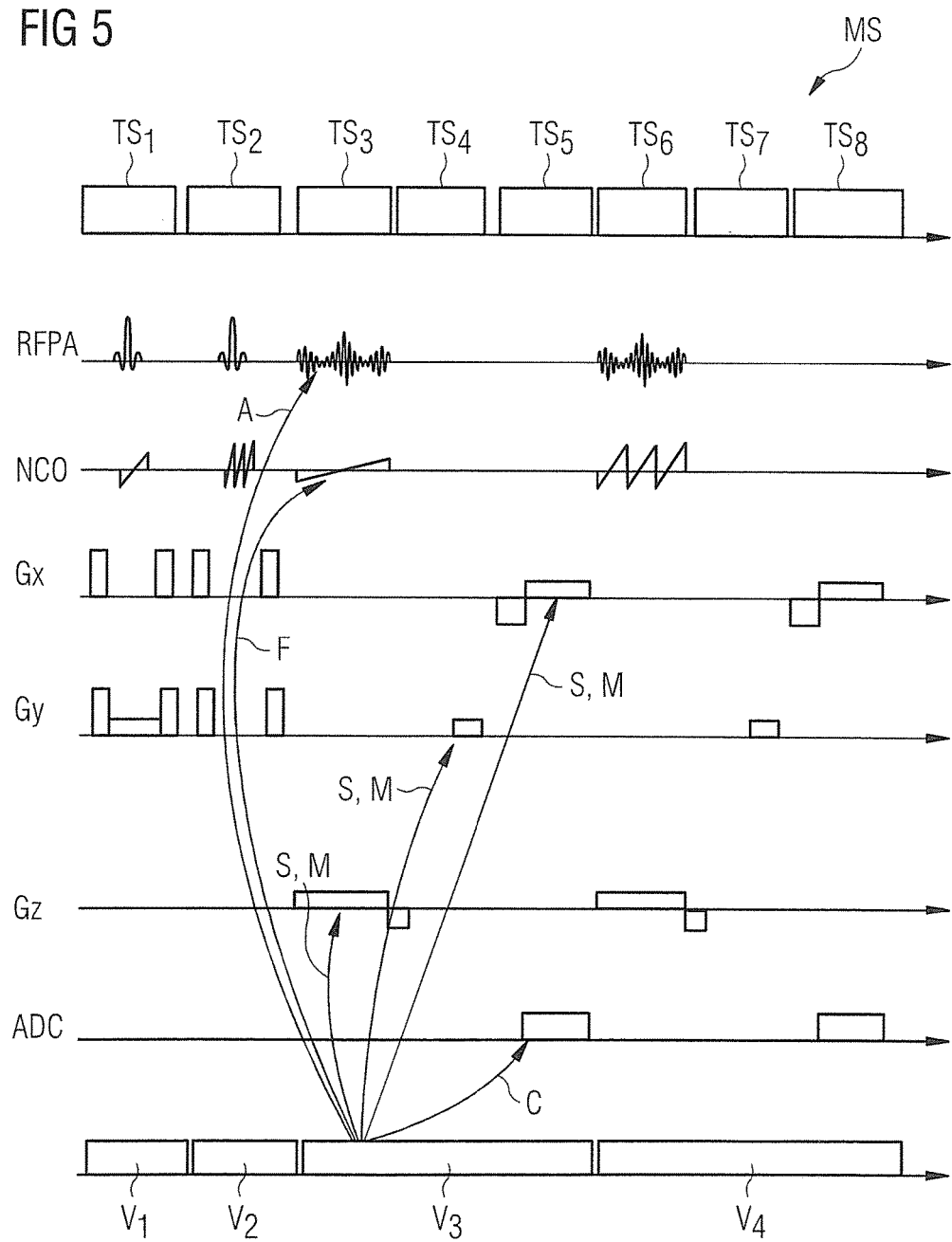
FIG. 5 shows the scan sequence having the individual sub-sequences and assigned effective volumes as in FIG. 3, but with a representation of the sub-system parameters optimized for the third effective volume.

The possibilities for optimizing the individual sub-systems to an effective volume assigned to a particular sub-sequence will first be explained again in general terms with reference to FIGS. 3 to 5 on the basis of a concrete, but greatly simplified scan sequence MS.

In the top row, different sub-sequences $TS_1$, $TS_2$, ..., $TS_8$ are denoted by individual blocks. The bottom section shows the effective volumes $V_1$, $V_2$, $V_3$, $V_4$ assigned to these sub-sequences $TS_1$, $TS_2$, ..., $TS_8$ of the scan sequence MS.

It can be seen from this that the first sub-sequence TS is assigned a first effective volume $V_1$ and the second sub-sequence $TS_2$ a second effective volume $V_2$. The sub-sequences $TS_3$, $TS_4$, $TS_5$ are assigned a common effective volume $V_3$. The sub-sequences $TS_6$, $TS_7$, $TS_8$ are likewise assigned an effective volume $V_4$.

Between the bottom and top row, the pulses to be emitted by the sub-systems are shown separately on separate time-lines for the individual sub-sequences. That is to say, the individual sub-sequences $TS_1$, $TS_2$, ..., $TS_8$ are carried out by the synchronous outputting of the pulses shown below the sub-sequences $TS_1$, $TS_2$, ..., $TS_8$ represented by the blocks, i.e. the setting of the corresponding parameters on the sub-systems. In the second row down, the RF pulse shapes and amplitudes to be emitted by the RF pulse amplifier RFPA are symbolically represented. In the second row, the NCO phase to be set is symbolized, wherein the slope of the curve corresponds to the frequency level. In the subsequent rows, the gradient pulses Gx, Gy, Gz are marked and, in the penultimate row, the readout window in which an analog/digital converter ADC is controlled to read out a selected receive coil. For simplicity, a single-channel transmit system is shown here. For multi-channel transmit systems, the RF pulse characteristic (amplitude and/or phase) could, for example, look different for each transmit element in order to implement the $B_1$ shim.

The first sub-sequence TS1 of the scan sequence MS is used here for regional saturation, i.e. all the nuclei within a regionally limited effective volume V1 are saturated. For this purpose short, intensive Gx and Gy gradients are first switched for dephasing. An RF pulse of a particular shape and amplitude is then emitted with a particular time-variable phase response produced by the NCO, the slope of which corresponds to the frequency of the RF pulse, while another Gy gradient pulse for slice selection is simultaneously transmitted. This sub-sequence concludes with another short, intensive gradient pulse in the x-direction and y-direction for dephasing.

Because the effective volume V1 is known, different parameters can be optimized automatically with respect to said effective volume V1. On the one hand, the amplitude A of the RF pulse to be transmitted and also, simultaneously, the frequency F produced by the NCO can be optimized. In addition, the shim offset currents S for the gradient coils Gx, Gy may be suitably set, and similarly suitable parameters for a Maxwell correction M may also be transferred here. The parameters locally optimized as a function of the respective effective volume $V_1$ are shown in FIG. 3 as arrows extending from the first volume $V_1$ in the bottom row.

Another sub-sequence $TS_2$ immediately following the first sub-sequence $TS_1$ is a chemical saturation, e.g. a fat saturation. This is effected similarly to the regional saturation by transmitting an RF pulse having a particular amplitude and a frequency predefined by the NCO, wherein here the frequency is set according to the chemical shift of the spin species to be suppressed. Here also only the dephasing pulses in the Gx and Gy gradient are switched (activated) prior to radiation of the RF pulse and after radiation of the RF pulse. There is no activation of a Gy gradient for slice selection (as in the first sub-sequence $TS_1$), as saturation can indeed take place globally, i.e. the effective volume $V_2$ is here the entire volume in the scanning space. FIG. 4 shows how, in the case of this sub-sequence $TS_2$, for example, the amplitude A and the frequency F are optimized for the current effective volume $V_2$.

This chemical saturation $TS_2$ is then followed by the actual acquisition of raw data for a first set of at least two slices in a slice multiplexing method using three sub-sequences $TS_3$, $TS_4$, $TS_5$, all of which have to act on the set of slices in question. This set of slices determines the associated effective volume $V_3$. The first sub-sequence $TS_3$ is used for slice excitation in the effective volume $V_3$. This is achieved by radiating a radio-frequency pulse RF having a particular amplitude and a frequency predefined by the NCO while simultaneously activating a Gz slice gradient pulse and a subsequent shorter, negative Gz rephasing pulse. The next sub-sequence TS4 is used for phase encoding. For this purpose only, a Gy gradient pulse is switched. In the subsequent sub-sequence TS5 the magnetic resonance signals produced in the effective volume V3 are read out by first activating a negative Gx gradient pulse for dephasing and then a positive Gx gradient pulse for rephasing, the ADC being simultaneously activated for reading-out. This completes the scanning of this set of slices. Optimizable parameters are illustrated in FIG. 5, again using arrows: the amplitude A of the transmitted RF pulse, the NCO phase and frequency F set for emitting the RF pulse and, for switching the gradient pulses Gx, Gy, Gz, again the parameters for the shim offset S and the Maxwell correction parameters M. With respect to the ADC, optimization can be performed to the extent that—if different readout coils (e.g. a number of local coils) are available, the best coil combination for the effective volume V3 in question is selected, which is symbolized by the coil selection parameter C.

Following the sub-sequence $TS_5$ with which the data is read out from the volume $V_3$, another set of slices can then be excited within the sub-sequence $TS_6$. This other set of slices is here constituted by the effective volume $V_4$. In a similar manner to the first set of slices, i.e. in the case of the effective volume $V_3$, a sub-sequence $TS_7$ for phase encoding and another sub-sequence $TS_8$ for reading out the set of slices then also takes place for the effective volume $V_4$ to determine the image data.

Further sets of slices can be read out in the same way, wherein corresponding sub-sequences must be repeated. Likewise, further saturation sub-sequences or other specific sub-sequences can also be inserted as required between the scanning of sets of slices, e.g. for labeling or marking of blood and other fluids whose characteristics in the body are to be established subsequently. Corresponding to the wide range of different possible sub-sequences and associated effective volumes, there also arise many different possibilities for optimizing parameters of the different sub-systems for the individual sub-sequences in respect of the assigned effective volumes.

Figure 6:
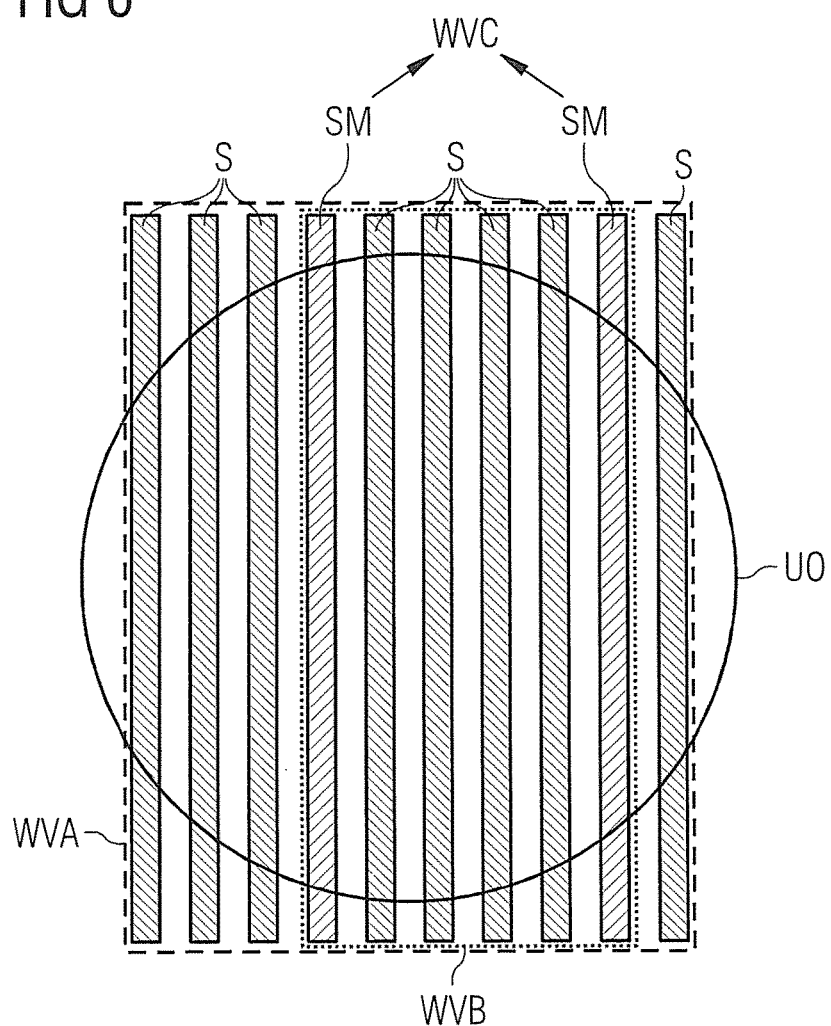
FIG. 6 is a schematic illustration of possible effective volumes in the case of slice multiplexing methods.

FIG. 6 schematically illustrates examples pf effective volumes WVA, WVB, WVC for slice multiplexing methods. All the slices to be scanned in respect of an associated object to be examined UO are represented by horizontal dotted bars S or hatched bars SM. For slice multiplexing methods a set of slices comprising at least two slices S, SM is excited using the same sub-sequence. In the case shown, two of the slices SM that are to be associated with such a set of slices SM are shown hatched.

In conventional methods, the volume WVA containing all the slices S to be scanned, and shown here with a dashed outline is generally used as the effective volume WVA. This means that non-ideal ambient conditions, as already explained above, cannot be satisfactorily compensated, so the achievable image quality is sub-optimal.

In an exemplary embodiment of the method according to the invention, an effective volume WVB of a functional sub-sequence can be defined by the envelope WVB, shown framed by dotted lines, of all the subvolumes manipulated in their magnetization using the associated sub-sequence and/or used for the acquisition process, which are the at least two slices SM in this example. In general, the volume WVB enclosed by the envelope WVB of the slices SM simultaneously excited by a sub-sequence is smaller than that of the envelope WVA of all the slices S, SM to be acquired by the scan. The focused optimization of the compensation settings to a smaller volume generally allows better compensation of non-ideal physical ambient conditions and therefore provides better image quality.

For example, in the case of a $B_0$ field inhomogeneity with quadratic dependency along the slice normal, adjustments of shim offsets and of the RF center frequency, or also of $B_0$ correction coils, can be used for local homogenization. The residual inhomogeneity is lower the smaller the extent of the volume to be homogenized along the slice normal. If, for example, between the slices SM to be excited using the same sub-sequence there is a relatively constant $B_0$ basic magnetic field which, however, varies markedly in the slices outside the volume WVB, only a sub-optimal compromise solution is determined and set for the control signals by the hitherto usual methods and using an effective volume WVA. By limiting the effective volume to an envelope WVB of the relevant slices SM, better compensation solutions can be identified and set, so that the image quality is improved.

In another exemplary embodiment of the method according to the invention, an effective volume WVC of a functional sub-sequence is defined by the union of all the subvolumes manipulated in their magnetization using the associated sub-sequence and/or used for the acquisition process, here: the two slices SM. In other words, the effective volume WVC no longer necessarily consists of a continuous region, but can contain a number of disjunctive (disjoint) regions SM. For optimizing the setting parameters of the control signals, the physical ambient conditions in this complex geometrical object are taken into account.

In further exemplary embodiments, definitions of the effective volume are conceivable which lie, so to speak, between the stated definitions concerning the envelope and the union of the subvolumes manipulated in their magnetization using the associated sub-sequence and/or used for the acquisition process. In this case an effective volume of a functional sub-sequence comprises at least all the subvolumes manipulated in their magnetization using the associated sub-sequence and/or used for the acquisition process.

In this case, the involvement of particular physical ambient conditions when generating the control signals can include a weighting, e.g. by a mask, of the particular physical ambient conditions, in particular according to their position relative to assigned effective volumes. Possible in this context are weightings using tissue masks, which specify different tissues, e.g. also of different organs, in terms of their spatial distribution. In this way, contributions in particular of pure noise regions can at least be reduced and spatial variations in physical ambient conditions can be particularly well compensated.

For example, if, in the slices SM to be excited using the same sub-sequence, a relatively similar $B_0$ basic magnetic field is present, but which varies markedly between these slices, techniques which incorporate this intermediate region into the effective volume will at best be able to identify and set compromise solutions. By limiting the effective volume WVC to the union of the relevant slices in accordance with the invention, compensation parameters resulting in better data quality can be identified and set.

Figure 7:
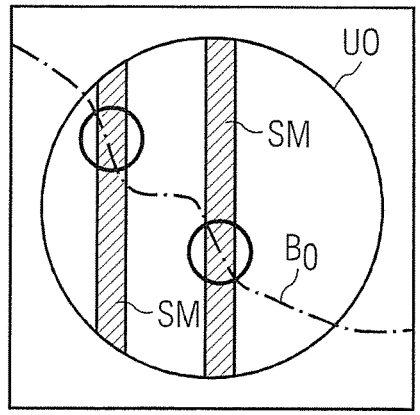
FIG. 7 schematically illustrates a characteristic of a value of an ambient condition in a scanned object.

It is also conceivable for the generation of the control signals to additionally or alternatively include acquisition of the order of the underlying transmitted sequence control data and physical ambient conditions and for the control signals to be generated such that higher-order sequence control data compensates lower-order physical ambient conditions. This is explained in the following example, illustrated by FIGS. 7 to 9. In the scenario, it is assumed that a $B_0$ basic field inhomogeneity with similar local gradients G1 along the slice normal is present in two slices SM to be excited using the same sub-sequence. In addition, the $B_0$ basic magnetic field exists between the two slices with a gradient G2<<G1. This situation is illustrated in FIG. 7, which shows the slices SM to be excited using the same sub-sequence in a scanned object UO represented by a circle. In addition, the characteristic of the $B_0$ basic magnetic field is represented by the dash-dotted line. It can be seen that the $B_0$ basic magnetic field runs within the two slices SM shown with strong gradients (first order) and with a markedly different average strength of the basic magnetic field $B_0$ (circled locations).

Figure 8:
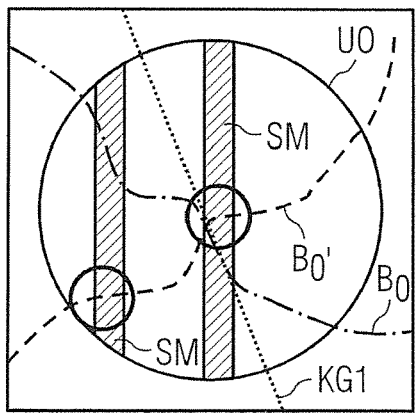
FIG. 8 schematically illustrates a characteristic of a value of an ambient condition in a scanned object when a first compensation gradient is switched.

As shown in FIG. 8, although in this situation the first-order main field inhomogeneity (i.e. the gradient thereof) can be compensated in the at least two slices SM by applying a compensation gradient offset KG1 of magnitude G1, this produces in both slices SM a different average 0th-order main field, as indicated by the resulting dashed-line corrected main magnetic field characteristic $B_0'$ (circled locations). A different average basic magnetic field can affect image quality.

Figure 9:
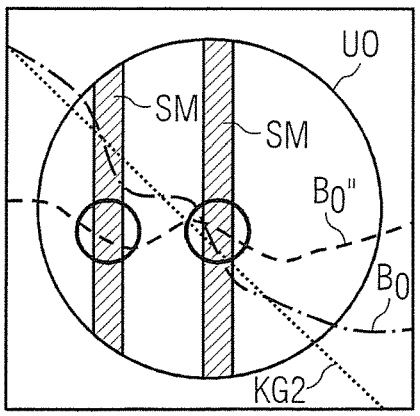
FIG. 9 schematically illustrates a characteristic of a value of an ambient condition in a scanned object when a second compensation gradient is switched.

However, if higher-order sequence control data are taken into account in accordance with the invention for compensating lower-order physical ambient conditions, this can be avoided. Thus, as shown in FIG. 9, e.g. the applied compensation gradient offset KG2 can also be used for equalization of the average basic field of the two slices by applying a gradient offset KG2 having an amplitude which is determined on the basis of the difference in the average basic field in the respective slices SM and the distance between the two slices SM. In particular, the gradient offset KG2 can be determined by dividing the difference in the average basic field in the respective slices SM by the distance between the slices SM. Although in this case residual gradients still occur in the slices SM, the average basic magnetic field is the same in each, as indicated by the resulting dashed-line basic magnetic field characteristic $B_0''$ (circled locations).

Depending on the application, either compensation of the local gradients or compensation of the different average main magnetic field can result in better image quality. The type of compensation selected can therefore be varied depending on the application, e.g. selected by the user or predefined automatically by the scan sequence selected by the user.

In addition, if fast switching higher-order (e.g. second-order) magnetic field coils are available, it is similarly conceivable for local gradients (first order) to be partially compensated.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for operating a medical imaging examination device having a plurality of sub-systems, said method comprising:

with a control computer, controlling the sub-systems in a coordinated manner in order to carry out a scan sequence in which at least two subvolumes of an object being scanned are individually defined and their respective magnetization in said at least two subvolumes are simultaneously manipulated by a sub-sequence and used for a scan data acquisition process according to a control protocol assigned to a scan sequence to be carried out that is transmitted to the control computer;

in the control computer, determining sequence control data relevant to the control protocol, said sequence control data defining different functional sub-sequences of a scan sequence associated with the control protocol;

in the control computer, assigning different effective volumes to each functional sub-sequence, taking into account the individually defined sub-volumes manipulated in their magnetization by an associated sub-sequence and used for the scan data acquisition process;

transmitting effective volume position data to the control computer, said volume position data defining the position and extent of the effective volumes assigned to the different functional sub-sequences;

in the control computer, determining current ambient conditions that exist in the medical imaging examination device that are critical for the determined relevant sequence control data and assigned effective volumes; and in the control computer, generating control signals for the different sub-systems based on the relevant sequence control data and the effective volume position data and the determined physical ambient conditions for carrying out the scan sequence such that the individual functional sub-sequences are locally optimized at least in respect of a sub-region of their assigned effective volume, and making the generated control signals available from the control computer in electronic form.

2. The method as claimed in claim 1, comprising the control signals prior to a start of the scan, and locating the generated control signals into the control computer from a memory during the scan.

3. The method as claimed in claim 1, comprising generating the control signals while the scan is ongoing, and using the generated control signals directly for the scan.

4. The method as claimed in claim 1, wherein an effective volume of a functional sub-sequence comprises at least all the subvolumes manipulated in their magnetization using the associated sub-sequence and/or used for the acquisition process.

5. The method as claimed in claim 1, wherein an effective volume of a functional sub-sequence is defined by the envelope of all the subvolumes manipulated in their magnetization using the associated sub-sequence and/or used for the acquisition process.

6. The method as claimed in claim 1, wherein an effective volume of a functional sub-sequence is defined by a union of all the subvolumes manipulated in their magnetization using the associated sub-sequence and/or used for the acquisition process.

7. The method as claimed in claim 6, comprising generating the control signals using respective weightings of the respective physical ambient conditions according to their position in relation to assigned effective volumes.

8. The method as claimed in claim 6, comprising generating the control signals dependent on an order of the transmitted sequence control data and physical ambient conditions, with the control signals being generated such that higher-order sequence control data equalize lower-order physical ambient conditions.

9. A medical imaging apparatus comprising:
a plurality of apparatus sub-systems;
a control computer configured to operate said plurality of apparatus sub-systems in a coordinated manner in order to carry out a scan sequence in which at least two subvolumes of an object being scanned are individually defined and their respective magnetization in said at least two subvolumes are simultaneously manipulated by a sub-sequence and used for a scan data acquisition process;
said control computer being configured to receive a control protocol assigned to a scan sequence to be carried out;
said control computer being configured to determine sequence control data relevant to the control protocol, said sequence control data defining different functional sub-sequences of a scan sequence associated with the control protocol;
said control computer being configured to assign different effective volumes to each functional sub-sequence, taking into account the individually defined subvolumes manipulated in their magnetization by an associated sub-sequence and used for the scan data acquisition process;
said control computer being configured to receive effective volume position data, said volume position data defining the position and extent of the effective volumes assigned to the different functional sub-sequences;
said control computer being configured to determine current ambient conditions that exist in the medical imaging examination device that are critical for the determined relevant sequence control data and assigned effective volumes; and
said control computer being configured to generate control signals for the different sub-systems based on the relevant sequence control data and the effective volume position data and the determined physical ambient conditions for carrying out the scan sequence such that the individual functional sub-sequences are locally optimized at least in respect of a sub-region of their assigned effective volume and to make the generated control signals available from the control computer in electronic form.

10. A medical imaging apparatus as claimed in claim 9 wherein said plurality of apparatus sub-systems form a magnetic resonance scanner.

11. A non-transitory, computer-readable data storage medium encoded with programming instructions, said data storage medium being loaded into a control computer of a medical imaging examination device having a plurality of sub-systems, said programming instructions causing said control computer to:
control the sub-systems in a coordinated manner in order to carry out a scan sequence in which at least two subvolumes of an object being scanned are individually defined and their respective magnetization in said at least two subvolumes are simultaneously manipulated by means of a sub-sequence and used for a scan data acquisition process;
receive a control protocol assigned to a scan sequence to be carried out;
determine sequence control data relevant to the control protocol, said sequence control data defining different functional sub-sequences of a scan sequence associated with the control protocol;
assign different effective volumes to each functional sub-sequence, taking into account the individually defined subvolumes manipulated in their magnetization by an associated sub-sequence and used for the scan data acquisition process;
receive effective volume position data to the control device, said volume position data defining the position and extent of the effective volumes assigned to the different functional sub-sequences;
determine current ambient conditions that exist in the medical imaging examination device that are critical for the determined relevant sequence control data and assigned effective volumes; and
generate control signals for the different sub-systems based on the relevant sequence control data and the effective volume position data and the determined physical ambient conditions for carrying out the scan sequence such that the individual functional sub-sequences are locally optimized at least in respect of a sub-region of their assigned effective volume and make the generated control signals available from the control computer in electronic form.

* * * * *